United States Patent
Church et al.

(10) Patent No.: US 6,231,354 B1
(45) Date of Patent: *May 15, 2001

(54) SYSTEM FOR MODIFYING PRINTED WIRING CONNECTIONS AFTER INSTALLATION

(75) Inventors: Daniel D. Church, Snohomish; David R. Gladish; Dai Hung Pham, both of Bellevue; John P. Webber, Seattle, all of WA (US)

(73) Assignee: The Boeing Company, Seattle, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,321

(22) Filed: Sep. 23, 1998

(51) Int. Cl.$^7$ .................................................. H01R 12/00
(52) U.S. Cl. .................................. 439/76.1; 439/510
(58) Field of Search .................................. 439/76.1, 751, 439/888, 891, 738, 908, 510, 511, 512, 78

(56) References Cited

U.S. PATENT DOCUMENTS

| | | | |
|---|---|---|---|
| 3,601,750 | * 8/1971 | Mancini | 439/888 |
| 4,017,143 | * 4/1977 | Knowles | 439/888 |
| 4,173,387 | * 11/1979 | Zell | 439/557 |
| 4,418,972 | 12/1983 | Benasutti | 439/79 |
| 4,530,551 | 7/1985 | Benasutti | 439/78 |
| 4,619,495 | * 10/1986 | Sochor | 439/637 |
| 4,874,326 | 10/1989 | Marolda, Jr. | 439/273 |
| 4,909,751 | 3/1990 | Marolda, Jr. | 439/273 |
| 5,127,838 | 7/1992 | Zaderej et al. | 739/74 |
| 5,257,949 | 11/1993 | Paulus | 439/620 |
| 5,312,265 | 5/1994 | Fiori et al. | 439/271 |
| 5,344,341 | 9/1994 | Yoshino | 439/607 |
| 5,509,823 | 4/1996 | Harting et al. | 439/607 |

* cited by examiner

Primary Examiner—Tulsidas Patel
(74) Attorney, Agent, or Firm—Conrad O. Gardner; Ann K. Galbraith

(57) ABSTRACT

A connector assembly mounted on a printed wiring board allowing modifications to be made to the connectivity using simple wiring techniques. The connector assembly contains special contacts providing three connections. One end of the contact mates with the source or destination of the signals in a modular electronic device. The other end accepts a wired contact for making additional connections not contained in the printed wiring board. The middle section of the contact makes a compliant connection to the printed wiring board. A signal can be disconnected from the printed wiring board by removing the contact and replacing it with a contact that is insulated from the printed wiring board.

7 Claims, 3 Drawing Sheets

SYSTEM FOR MODIFYING PRINTED WIRING CONNECTIONS AFTER INSTALLATION

BACKGROUND OF THE INVENTION

Introduction

On airplanes, modular electronic devices are mounted on fixed shelves. The electronic connections between the modular electronic devices are made with interconnecting wire bundles. It has been shown that a printed wiring board (PWB) in place of the interconnecting wire bundles would save weight, space, and cost.

However, the airplane industry has a history of introducing modifications to electrical wiring in the field. Whereas changes to wire bundles can be made directly in the airplane, making changes (cuts and jumpers) to a PWB cannot. Therefore, PWBs have not replaced wire bundles.

Background

Traditionally, the connections between modular electronic devices on commercial airplanes have been made with wire bundles. It has been shown that in cases where a series of modular electronic devices are mounted on fixed shelves, a printed wiring board in place of the interconnecting wire bundles would save weight, save space and cost less to produce.

The airplane industry has a history of introducing modifications to electrical wiring in the field. Airlines perceive changes to printed wiring boards using conventional methods as an obstacle to their use. The confines of the electronics bay of a commercial airplane do not allow the kind of precision work needed for making PWB modifications. The soldering irons needed for adding jumpers is considered hazardous in the flightline environment where fuel vapors are sometimes present.

Printed wiring boards in combination with wire wrap technology has been proposed as an alternative to pure printed circuits. While this solution offered a good way of adding jumpers, it did not offer practical advantages for making cuts. Wire wrap has also been viewed with disfavor due to its susceptibility to foreign object contamination.

Problem Solved by the Present Invention

Once a device with a printed wiring board is designed and built, it is difficult or impossible to change the connectivity of the wiring board in the field in the end product. Making changes to printed wiring boards has traditionally been done by adding "cuts" and "jumpers" to the board. The cut and jumper work is typically only performed in special repair facilities by specially trained technicians using specialized tools. The "cuts" are made by drilling or scraping away the copper trace where the connection is no longer desired. The operation often requires precision in locating the proper trace. The "jumpers" are added by soldering the ends of an insulated wire to the points where a new connection is desired.

The present invention allows changes in connectivity to be introduced to a device using only the tools, skills and materials that would be familiar to a mechanic with a background working with wire bundles. Further, the modifications can be done where the printed wiring board is installed instead of a repair facility.

BRIEF SUMMARY OF THE INVENTION

The present invention enables the use of PWBs to replace interconnecting wire bundles. Therefore, changes in connectivity may be introduced using only tools, skills, and materials familiar to the mechanic instead of the requirement of a repair facility.

A novel connector assembly is hereinafter described. The present connector assembly contains special contact providing three connections. The front end of the contact mates with the connector for a modular electronic device. The rear end can accept a wired contact for making additional connections not contained in the PWB. The middle section of the contact makes a compliant connection to the board. Additionally, a signal can be disconnected from the PWB by removing the contact and replacing it with a contact that is insulated from the PWB. Thus, the present invention allows the opening of an existing connection, adding a connection, or replacing a connection.

A hereinafter described embodiment of the present invention comprises a connector with a double ended pin contact with compliant section, a double ended pin contact with an insulated section, and the flexibility of adding connecting wires to any contact in the connector using a rear insert.

Prior Art Patent Literature

Harting et al., U.S. Pat. No. 5,509,823—"Electrical Mating Connector"

This patent relates to a shielding technique for a connector.

Fiori et al., U.S. Pat. No. 5,312,265—"Electrical Connector Suitable for Use With Variable Numbers of Electrical Conductors"

This patent relates to a way of keeping a connector sealed from moisture or other contaminants even with empty contact locations.

Yoshino, U.S. Pat. No. 5,334,341 "Connector Having Electromagnetic Shielding Film"

This patent relates to a manner of providing shielding around each individual contact of a connector to prevent crosstalk between pins.

Benasutti, U.S. Pat. No. 4,530,551 "Circuit Change Pin for Printed Wiring Board"

The purpose of the patent is to make a change to a printed circuit backplane using an elongated connector contact that is insulated from the printed wiring board plated through hole. The contact in this patent is in two pieces. It appears that the two-piece contact would require access to both sides of the printed circuit board. The present one-piece contact can be installed with access to only one side of the board.

Zaderej, U.S. Pat. No. 5,127,949 "Plated Electrical Connectors"

This patent involves forming electrical connectors as an integral part of the manufacture of a printed wiring board.

Paulas, U.S. Pat. No. 5,257,949 "Connector with Interchangeable Contacts"

This patent covers a sophisticated type of filter connector with provisions for different types of filter contacts and transient suppression contacts.

Marolda, U.S. Pat. No. 4,909,751 "Underwater Mateable Electrical Connector"

This patent covers an electrical connector that can be mated while it is submerged in water.

Marolda, U.S. Pat. No. 4,874,326 "Elastomeric Electrical Isolation Membrane"

This patent relates to an underwater connector.

Benasutti, U.S. Pat. No. 4,418,326 "Electrical Connector for Printed Wiring Board"

This patent covers a soldered connector that can be disassembled to allow cleaning and replacement of damaged contacts.

DETAILED DESCRIPTION OF THE INVENTION

Figure 1:
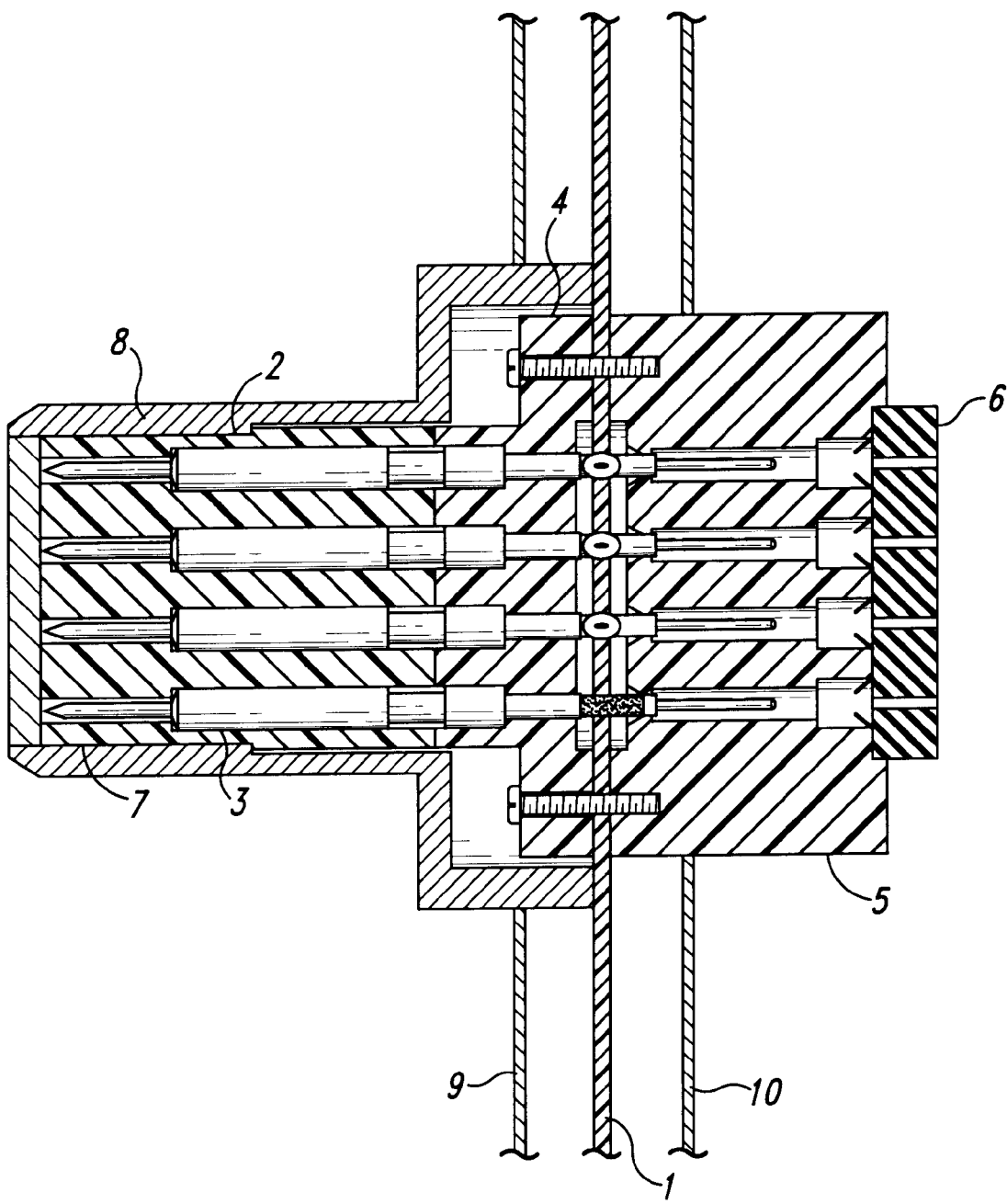
FIG. 1 is a cut-away view of a preferred embodiment of the present system for modifying printed wiring connectors.

The printed wiring board 1 contains copper traces that carry electrical signals between the plated through holes. The plated through holes are where electrical connections are made between the traces and connector contacts.

The double-ended connector pin contact with compliant section 2 makes an electrical connection between the device that mates with the connector and the plated through hole in the printed wiring board. The contact is not soldered in place. Prior to insertion, the diameter of the compliant section is larger than the diameter of the plated through hole. When the contact is installed, the compliant section is under compression in the plated through hole creating a physical, gas tight, electrical connection to the plated through hole. The contact extends through the plated through hole to form a second mating interface on the far side of the printed wiring board. The end of the contact on the far side of the printed wiring board is used as a connection node for wires added as part of a connection modification.

The double-ended connector pin contact with insulated section 3 electrically isolates the contact from the plated through hole in the printed wiring board 1. The contact has, in place of a compliant section, an insulated sleeve that prevents electrical conduction with the plated through hole. The contact extends through the plated through hole to form a second mating interface on the far side of the printed wiring board. The end of the contact on the far side of the printed wiring board is used as a connection node for wires added as part of a connection modification.

The bottom insert 4 and the connector insert 7 and the contacts 2 and 3 are installed as an assembly into the printed wiring board. The bottom insert 4 and the connector insert 7 captures the contacts as an insert set. The bottom insert 4 prevents the contacts from being forced through the printed wiring board by a miss-aligned mating contact.

The connector insert 7 holds the double-ended connector pin contact in place and it is also used as a mass insertion tool. Force applied by a press to the front of the insert is transferred to the contacts through the insert and forces the compliant sections into the plated through holes.

The rear insert 5 captivates the mating socket contact of a jumper wire that connects to the extended portion of the double-ended connector pin contact.

The rubber grommet 6 (part of the rear insert) provides wire support and some protection of the contact area inside the rear insert from foreign objects and moisture.

The connector shell 8 (mounting fasteners are not shown) captivates the connector insert and provides the rugged mechanical interface required to interface to a modular electronic device.

The front housing 9 and the rear housing 10 are metal covers that protect the assembly from foreign objects and provide additional stiffness to the assembly.

Opening a Connection

Figure 2:
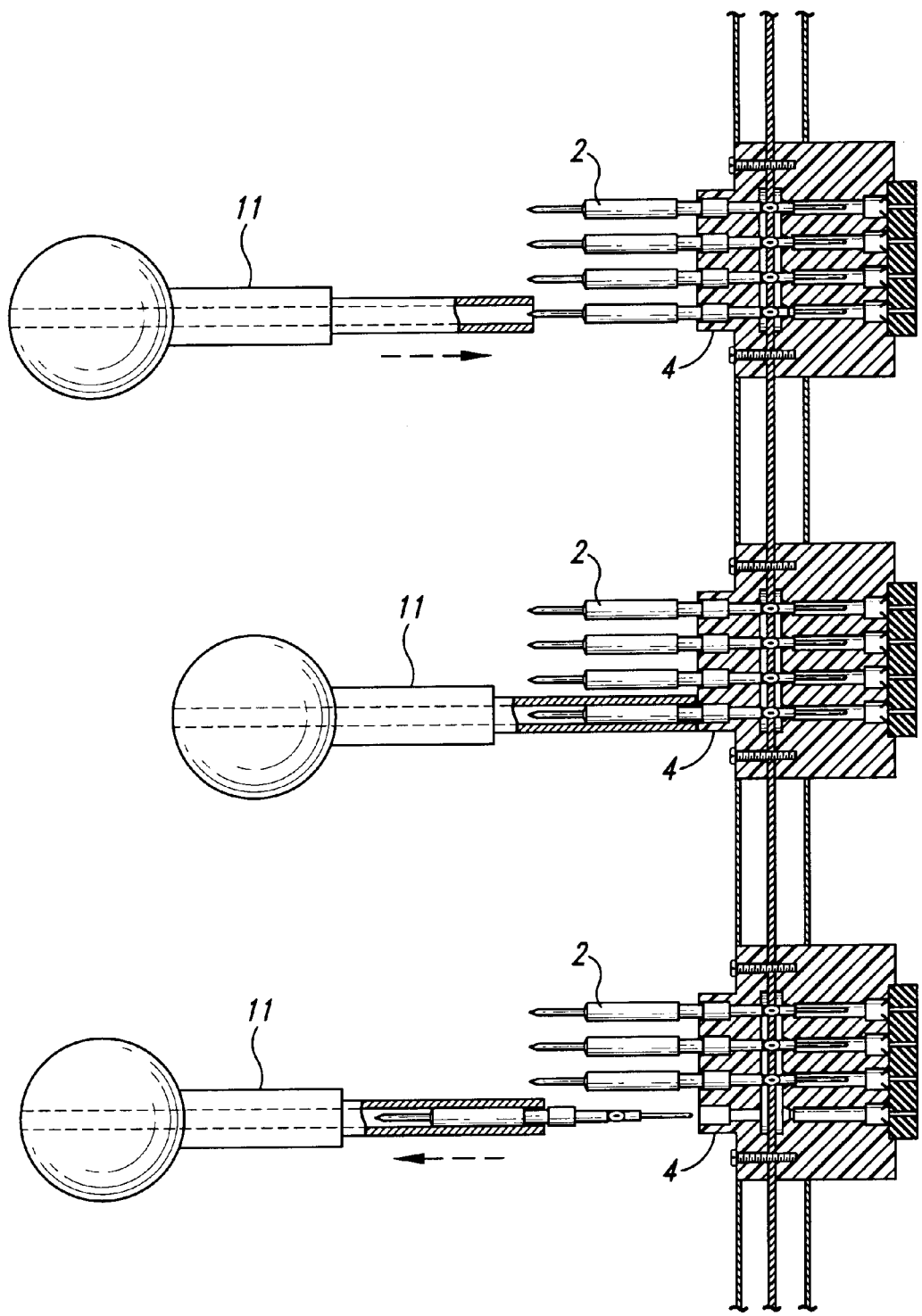
FIG. 2 is illustrative of the present system with the connector shell and connector insert removed and illustrates the sequence of removing the double-ended connector pin contact hereinafter described.

Remove fasteners (not shown) from the connector shell 8 and remove the shell. Slide the connector insert 7 off of the double-ended connector pin contacts 2. FIG. 2 shows the system with the connector shell and connector insert removed. It illustrates the sequence of removing a double-ended connector pin contact 2 described next.

Slide the hollow shaft of the contact removal tool 11 over the end of the double-ended connector pin contact.

The contact removal tool 11 grabs the ledge of the largest diameter of the contact such that when a force is applied to the tool away from the printed wiring board the contact is extracted from the printed wiring board. Remove the contact from the contact removal tool by pushing the contact further into the shaft until it falls out the other end of the shaft near the handle.

Slide the connector insert 7 over the double-ended connector contacts 2 that remain installed. Fasten the connector shell over the connector insert.

Adding a Connection:

Prepare a wire of sufficient length terminated to a MIL-C-39029 or similar socket contact. Using a MIL-I-81969 or similar wire insertion tool, insert one end of the prepared wire through the rubber grommet 6 of the rear insert 5 at the location of the contact carrying the desired signal. Using the same insertion tool, insert the other end of the prepared wire through the rubber grommet of the rear insert at the location of the contact that is to receive the signal.

Replacing a Connection:

There are often cases where a signal must be disconnected from the plated through hole on the printed wiring board but a connection must also be added. In this case the following steps are used:

Remove fasteners (not shown) from the connector shell 8 and remove the shell. Slide the connector insert 7 off of the double-ended connector pin contacts 2. Slide the hollow shaft of the contact removal tool 11 over the end of the double-ended connector pin contact 2. Pull the tool back away from the printed wiring board thereby removing the contact as described in Opening a Connection and as shown in FIG. 2. In place of the removed contact, install a double-ended connector pin contact with insulated section 3. The contact will slide into place. Slide the connector insert over the double-ended connector pin contacts. Fasten the connector shell over the connector insert. Add a connection with a wire as described in Adding a Connection.

Figure 3:
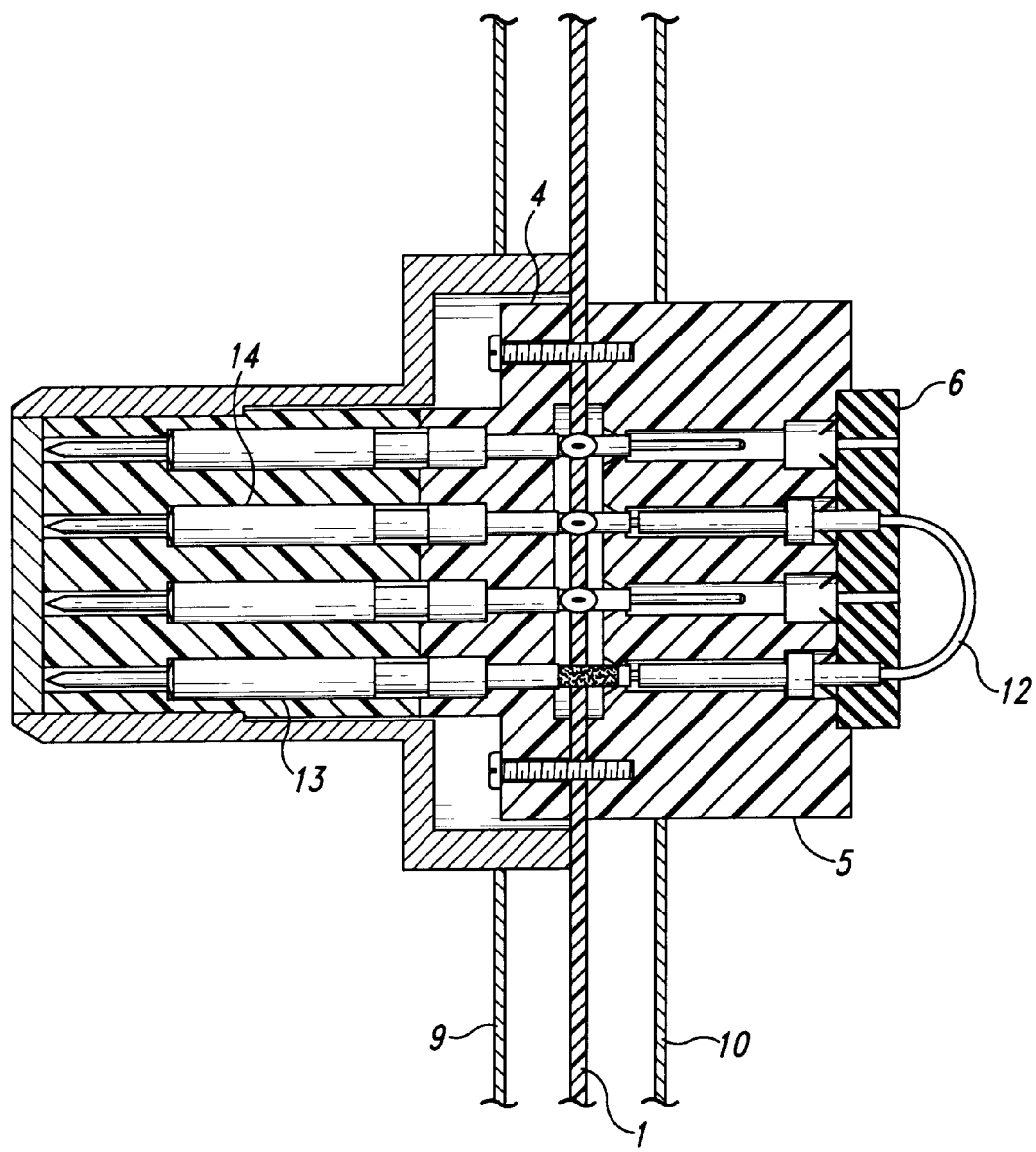
FIG. 3 is illustrative of a replaced connection.

FIG. 3 illustrates one example of a replaced connection. A short length of insulated wire 12 installed on the rear insert 5 makes a connection between a contact 13 isolated from the board and another contact 14.

Modifying connections using the aforementioned system accomplishes what cuts and jumpers accomplish in conventional printed wiring board systems except it:

Does not require precision removal of conductive material;

Does not require soldering devices and drills; and

Uses the type of tools and techniques currently in use in field service of airplanes.

Unique features of the present invention include:

Connector contacts that can be removed with minor disassembly of the connector;

A double-ended connector pin contact having a compliant section;

A double-ended connector pin contact having an insulated section; and

Connecting wires can be added to any signal carried in the connector using the rear insert.

What is claimed is:

1. A connector assembly comprising:
    (a) a printed wiring board having a first side and second side, and plurality of copper-plated holes therein;

(b) a plurality of individually removable, elongated contact pins engaged and electrically connected with the holes in the printed wiring board by way of a compliant middle section, and adapted on one end thereof for contact with single wire socket contact devices;

(c) a connector insert positioned on the first side of the printed wiring board and having holes therein extending from one side of the insert to the other, adapted for receiving one end of the pins through one side thereof, and for connecting the pins to a modular electronic device connector on the other;

(d) a rear insert positioned on the second side of the printed wiring board, having holes therein adapted for receiving the other end of the pins through one side thereof while providing a means to engage and releasably secure single-wire socket contact devices on the other.

2. The connector assembly of claim 1 wherein the rear insert is comprised of an insulating material and contains flexible metal clips along the inner periphery of the holes to releasably secure the socket contact devices.

3. The connector assembly of claim 1 that additionally comprises a jumper wire having socket contact devices on both ends thereof, providing an electrical connection between two contact pins on the rear insert side of the assembly.

4. The connector assembly of claim 1 that additionally comprises an elongated pin positioned in one of the holes of the board, the pin having an insulating sleeve that prevents a electrical signal from being transmitted between the pin and the board.

5. The connector assembly of claim 1 wherein the profile of the inner periphery of the holes in the connector insert and the profile of the pins are adapted to keep the pins in position when the connector insert is fastened in place.

6. The connector assembly of claim 1 that additionally comprises a bottom insert between the connector insert and the printed wiring board adapted to properly align the contact pins prior to insertion in the printed wiring board, and the profile of the pins and the inner periphery of the holes in the bottom insert are adapted to provide a stop for ins on insertion the printed wiring board.

7. The connector assembly of claim 1 that additionally comprises a connector shell that covers the connector insert.

* * * * *